(12) United States Patent
Liu et al.

(10) Patent No.: US 11,072,848 B2
(45) Date of Patent: Jul. 27, 2021

(54) HIGH TEMPERATURE SPUTTERED STOICHIOMETRIC TITANIUM NITRIDE THIN FILMS

(71) Applicant: The Government of the United States of America, as represented by the Secretary of the Navy, Arlington, VA (US)

(72) Inventors: Xiao Liu, Fairfax, VA (US); Battogtokh Jugdersuren, Alexandria, VA (US); Brian T. Kearney, Martinez, CA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 60 days.

(21) Appl. No.: 16/253,264

(22) Filed: Jan. 22, 2019

(65) Prior Publication Data
US 2019/0276925 A1  Sep. 12, 2019

Related U.S. Application Data

(60) Provisional application No. 62/640,700, filed on Mar. 9, 2018.

(51) Int. Cl.
*C23C 14/35*  (2006.01)
*C23C 14/00*  (2006.01)
(Continued)

(52) U.S. Cl.
CPC ........ *C23C 14/0036* (2013.01); *C23C 14/025* (2013.01); *C23C 14/0641* (2013.01);
(Continued)

(58) Field of Classification Search
CPC ............. C23C 14/0036; C23C 14/025; C23C 14/0641; C23C 14/35; C23C 14/5806; H01L 35/08; H01L 35/22; H01L 35/34
(Continued)

(56) References Cited

U.S. PATENT DOCUMENTS 4,783,248 A * 11/1988 Kohlhase .......... H01L 21/76843
                                                              204/192.17
5,487,922 A    1/1996 Nieh et al.
(Continued)

FOREIGN PATENT DOCUMENTS

JP    04-032563       *  2/1992
JP    2016-181571     * 10/2016
KR    20070020058 A      2/2007

OTHER PUBLICATIONS

Inoue et al. "Preparation of compositionally gradient Ti—TiN films by R.F. reactive sputtering", Thin Solid Films 261 (1995) 115-119 (Year: 1995).*

(Continued)

*Primary Examiner* — Rodney G McDonald
(74) *Attorney, Agent, or Firm* — US Naval Research Laboratory; Joslyn B. Barritt

(57) ABSTRACT

A method for producing high-temperature sputtered stoichiometric TiN thin films. A substrate is placed in a sputtering chamber a Ti target to be sputtered and the substrate temperature is controlled to be between room temperature and about 800° C. The sputtering chamber is evacuated to a base pressure of $2\times10^{-7}$ Torr or lower, The Ti target is presputtered under an Ar gas flow at a pressure of 2-15 mTorr in a radio frequency (RF) power of 50-200 W. The Ti is then sputtered onto the substrate in the presence of $N_2$ and Ar gas flows under the same pressure and RF power, with the ratio of $N_2$ to Ar favoring N to ensure that the film is nitrogen-saturated.

4 Claims, 5 Drawing Sheets

(51) Int. Cl.
| | |
|---|---|
| C23C 14/02 | (2006.01) |
| C23C 14/06 | (2006.01) |
| C23C 14/58 | (2006.01) |
| H01L 35/34 | (2006.01) |
| H01L 35/08 | (2006.01) |
| H01L 35/22 | (2006.01) |

(52) U.S. Cl.
CPC .......... *C23C 14/35* (2013.01); *C23C 14/5806* (2013.01); *H01L 35/08* (2013.01); *H01L 35/22* (2013.01); *H01L 35/34* (2013.01)

(58) Field of Classification Search
USPC .................................................. 204/192.17
See application file for complete search history.

(56) References Cited

U.S. PATENT DOCUMENTS

| | | | | |
|---|---|---|---|---|
| 5,652,464 | A | * | 7/1997 | Liao .................. H01L 21/28518 257/751 |
| 5,858,183 | A | * | 1/1999 | Wolters ............... C23C 14/0641 204/192.13 |
| 9,472,745 | B2 | | 10/2016 | Liu et al. |
| 9,577,174 | B2 | | 2/2017 | Liu et al. |

OTHER PUBLICATIONS

White et al. "Surface/interface analysis and optical properties of RF sputter-deposited nanocrystalline titanium nitride thin films", Applied Surface Science, 292 (2014) 74-85. (Year: 2014).*
Ghasemi et al. "Corrosion behavior of reactive sputtered Ti/TiN nanostructured coating and effects of intermediate titanium layer on self-healing properties", Surface & Coatings Technology 326 (2017) pp. 156-164 (Year: 2017).*
Mancarella et al. "Fabrication of Pt-polysilicon thin-film thermopiles: a preliminary study", 2005, IEEE, pp. 1141-1144 (Year: 2005).*
Machine Translation JP 04-032563 (Year: 1992).*
Machine Translation JP 2016-181571 (Year: 2016).*
.F. Creemer et al., "Microhotplates with TiN heaters," Sensors and Actuators A 148 (2008) 416-421.
P. Patsalas et al., "Optical, electronic, and transport properties of nanocrystalline titanium nitride thin films," Journal of Applied Physics 90, 4725 (2001).
Nikhil K. Ponon et al., "Effect of deposition conditions and post deposition anneal on reactively sputtered titanium nitride thin films," Thin Solid Films 578 (2015) 31-37.
Adam Tarniowy et al., "The effect of thermal treatment on the structure, optical and electrical properties of amorphous titanium nitride thin films," Thin Solid Films 311, 93 (1997).
Fitriani, "A review on nanostructures of high temperature thermoelectric materials for waste heat recovery," Renewable and Sustainable Energy Reviews 64 (2016) 635-659.
Junichiro Shiomi, "Research Update: Phonon engineering of nanocrystalline silicon thermoelectrics," Apl. Materials 4, 104504 (2016).
Y.L. Jeyachandran et al., "Properties of titanium nitride films prepared by direct current magnetron sputtering," Materials Science and Engineering A 445-446 (2007) 223-236.
J. Westlinder et al., "On the Thermal Stability of Atomic Layer Deposited TiN as Gate Electrode in MOS Devices," IEEE Electron Device Letters, vol. 24, No. 9, Sep. 2003.
W. Spengler et al., "Raman scattering, superconductivity, and phonon density of states of stoichiometric and nonstoichiometric TiN," Physical Review B 17, 1095 (1978).
R. Chowdhury et al., "Characteristics of titanium nitride films grown by pulsed laser deposition," Journal of Materials Research 11, 1458 (1996).
C. Constable et al., "Raman microscopic studies of PVD hard coatings," Surface and Coatings Technology 116, 155 (1999).
Y. Cheng et al., "Substrate Bias Dependence of Raman Spectra for TiN Films Deposited by Filtered Cathodic Vacuum Arc," Journal of Applied Physics 92, 1845 (2002).
H. Y. Chen et al., "Oxidation behavior of titanium nitride films," Journal of Vacuum Science & Technology A: Vacuum, Surfaces, and Films 23, 1006 (2005).
Li Jian Meng, "Deposition and properties of titanium nitride films produced by dc reactive magnetron sputtering," Vacuum 46, 233 (1995).
Rajarshi Banerjee et al., "Influence of the sputtering gas on the preferred orientation of nanocrystalline titanium nitride thin films," Thin Solid Films 405, 64 (2002).
William D. Sproul et al., "The Effect of Target Power on the Nitrogen Partial Pressure Level and Hardness of Reactively Sputtered Titanium Nitride Coatings," Thin Solid Films 171, 171 (1989).
Li Jian Meng, "Characterization of Titanium Nitride Films Prepared by D.C. Reactive Magnetron Sputtering at Different Nitrogen Pressures," Surface and Coatings Technology 90, 64 (1997).
N. Saoula et al., "Study of the deposition of Ti/TiN multilayers by magnetron sputtering," Surf. Interface Anal. 2010, 42, 1176-1179.
C.A. Dimitriadis, "Characteristics of TiNx /n-Si Schottky diodes deposited by reactive magnetron sputtering," J. Appl. Phys. vol. 85, No. 8 (1999) 4238-4242.
Ning Jiang et al., "XPS study for reactively sputtered titanium nitride thin films deposited under different substrate bias," Physica B 352 (2004) 118-126.
S. Ohya et al., "Room temperature deposition of sputtered TiN films for superconducting coplanar waveguide resonators," Supercond. Sci. Technol. 27 (2014) 015009.
K. Vasu et al., "Substrate-temperature dependent structure and composition variations in RF magnetron sputtered titanium nitride thin films," Applied Surface Science 257 (2011) 3069-3074.
P. Patsalas et al., "The effect of substrate temperature and biasing on the mechanical properties and structure of sputtered titanium nitride thin films," Surface and Coatings Technology 125 (2000) 335-340.
H. Z. Wu et al., "Characterization of Titanium Nitride Thin Films," Thin Solid Films, 191 (1990) 55-67.
Harish C. Barshilia et al., "Raman spectroscopy studies on the thermal stability of TiN, CrN, TiAlN coatings and nanolayered TiN/CrN, TiAlN/CrN multilayer coatings," J. Mater. Res., vol. 19, No. 11, Nov. 2004, 3196-3205.
Y. Massiani et al., "Electrochemical Study of Titanium Nitride Films Obtained by Reactive Sputtering," Thin Solid Films, 191 (1990) 305 316.
P. Patsalas et al., "Interface properties and structural evolution of TiN/Si and TiN/GaN heterostructures," J. Appl. Phys., vol. 93, No. 2, 989-998 (2003).
N.K. Ponon et al., "Effect of deposition conditions and post deposition anneal on reactively sputtered titanium nitride thin films," Thin Solid Films 578 (2015) 31-37.
Y. Jin et al., "Electrical Properties of DC Sputtered Titanium Nitride Films with Different Processing Conditions and Substrates," Journal of the Korean Ceramic Society, vol. 42, No. 7, pp. 455-460, 2005.
Search Report and Written Opinion dated May 8, 2019 in corresponding International Application No. PCT/US2019/014438.

* cited by examiner

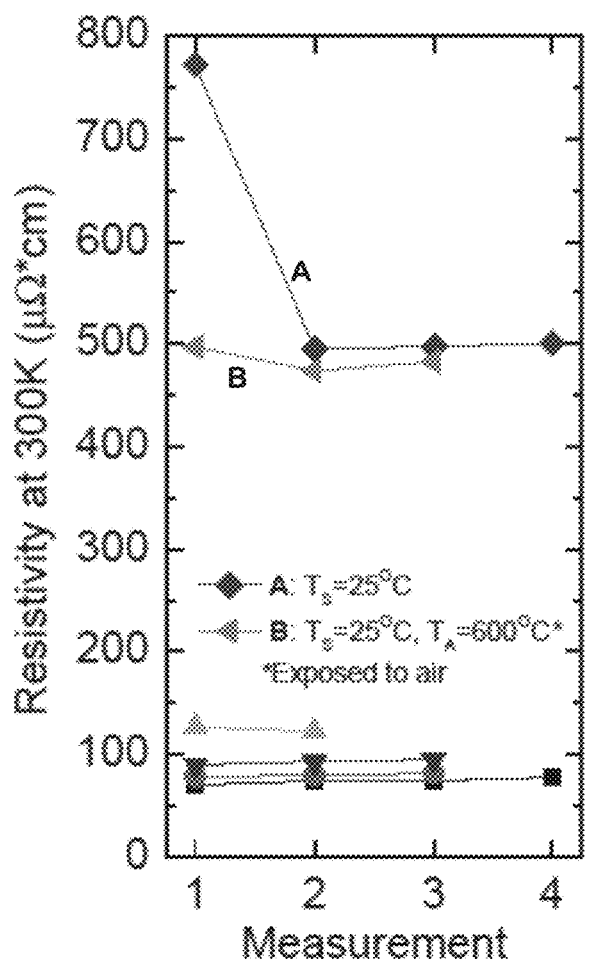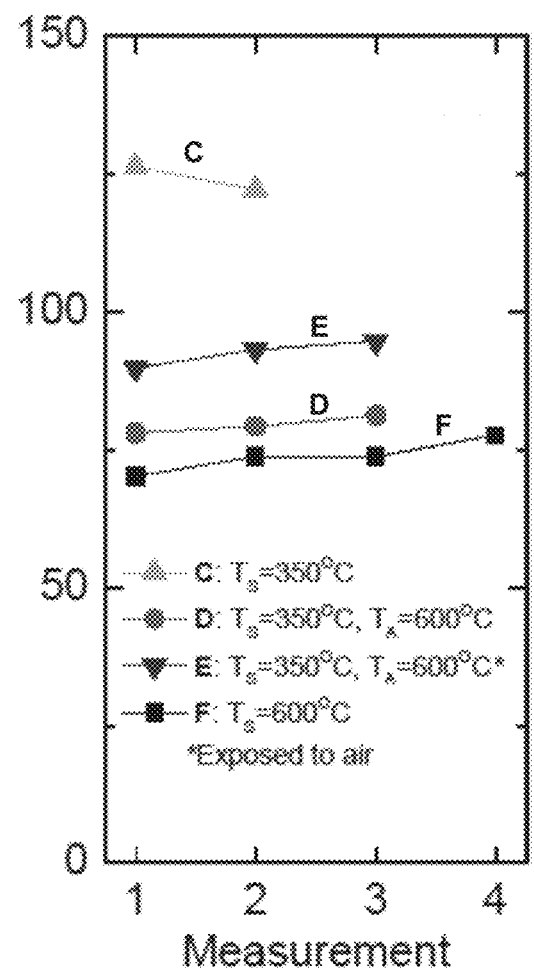
FIG. 2A
FIG. 2B

HIGH TEMPERATURE SPUTTERED STOICHIOMETRIC TITANIUM NITRIDE THIN FILMS

CROSS-REFERENCE

This Application is a Nonprovisional of and claims the benefit of priority under 35 U.S.C. § 119 based on U.S. Provisional Patent Application No. 62/640,700 filed on Mar. 9, 2018. The Provisional Application and all cited references are hereby incorporated by reference into the present disclosure in their entirety.

TECHNICAL FIELD

The present disclosure relates to thin films, particularly to sputtered titanium nitride (TiN) thin films prepared at high substrate temperature and/or annealed at high temperature.

BACKGROUND

Thin film titanium nitride (TiN) has been of interest for many years in a variety of applications such as ultrahard wear-resistant coatings, resistive heating elements and temperature sensors, electric contacts, and diffusion barriers due to its high hardness, high melting point, good thermal stability, good electrical conductivity, and excellent corrosion and diffusion resistance. Recently, some applications of electronic devices demand operation at temperatures higher than typical operating temperatures of around 100° C.

One example of such high-temperature devices are thin film nanocrystalline silicon-based thermoelectric devices such as those described in U.S. Pat. No. 9,472,745 to Liu et al, entitled "CVD Nanocrystalline Silicon As Thermoelectric Material" and U.S. Pat. No. 9,577,174 to Liu et al., entitled "CVD Nanocrystalline Silicon Thermoelectric Material," both of which have inventors in common with the present disclosure.

Other applications of thin film materials include electronics aboard hypersonic vehicles. In addition, aerospace, automotive, and petrochemical industries have an increased demand for higher temperature electronics to monitor the performance of systems in harsh high temperature environments. For many of these operations, the constituent materials used in these thin films have to survive a high temperature environment. Most electrical resistivity work on these films is done, however, at temperatures below 100° C., and few studies have examined the resistivity of TiN beyond this temperature range. See, e.g., J. F. Creemer et al., "Microhotplates with TiN heaters," *Sensors and Actuators A* 148 (2008) 416-421. This is probably the case because many practical electronics applications already fall within this temperature range, but many do examine the effects of annealing and high temperature deposition to improve room temperature conductivity. See P. Patsalas et al., "Optical, electronic, and transport properties of nanocrystalline titanium nitride thin films," *Journal of Applied Physics* 90, 4725 (2001); Nikhil K. Ponon et al., "Effect of deposition conditions and post deposition anneal on reactively sputtered titanium nitride thin films," *Thin Solid Films* 578 (2015) 31-37; and Adam Tarniowy et al., "The effect of thermal treatment on the structure, optical and electrical properties of amorphous titanium nitride thin films," *Thin Solid Films* 311, 93 (1997). Several applications of thin film materials, such as MEMS hotplates and nanocrystalline silicon thermoelectrics, involve the use of sustained operating temperatures higher than 100° C. See Creemer et al., supra; see also Fitriani, "A review on nanostructures of high-temperature thermoelectric materials for waste heat recovery," *Renewable and Sustainable Energy Reviews* 64 (2016) 635-659; see also Junichiro Shiomi, "Research Update: Phonon engineering of nanocrystalline silicon thermoelectrics," *Apl. Materials* 4, 104504 (2016).

Some TiN films have sheet resistances that do not have a linear temperature dependence as they are brought to temperatures higher than their deposition temperature. See Creemer et al., supra, and Tarniowy et al., supra; see also Y. L. Jeyachandran et al., "Properties of titanium nitride films prepared by direct current magnetron sputtering," *Materials Science and Engineering A* 445-446 (2007) 223-236. This suggests that TiN films are not stable when they exceed their deposition or annealing temperatures and that, even with otherwise optimal deposition parameters, substrate temperature and annealing are critical to high temperature performance.

Several methods exist for depositing TiN, such as atomic layer deposition (ALD), chemical vapor deposition (CVD), pulsed laser deposition, and cathodic vacuum arc deposition. See J. Westlinder et al., "On the Thermal Stability of Atomic Layer Deposited TiN as Gate Electrode in MOS Devices," *IEEE Electron Device Letters*, Vol. 24, No. 9, Sep. 2003; W. Spengler et al., "Raman scattering, superconductivity, and phonon density of states of stoichiometric and nonstoichiometric TiN," *Physical Review B* 17, 1095 (1978); R. Chowdhury et al., "Characteristics of titanium nitride films grown by pulsed laser deposition," *Journal Of Materials Research* 11, 1458 (1996); C. Constable et al., "Raman microscopic studies of PVD hard coatings," *Surface and Coatings Technology* 116, 155 (1999); Y. Cheng et al., "Substrate Bias Dependence of Raman Spectra for TiN Films Deposited by Filtered Cathodic Vacuum Arc," *Journal Of Applied Physics* 92, 1845 (2002); and H.-Y. Chen et al., "Oxidation behavior of titanium nitride films," *Journal of Vacuum Science & Technology A: Vacuum, Surfaces, and Films* 23, 1006 (2005).

Sputtering techniques are known to typically produce dense, uniform films which are particularly suitable for use as thin barrier layers. Reactive sputtering is a well-established deposition method which is known to produce high quality, low resistance thin films of TiN. Sputtering parameters such as nitrogen percentage, total pressure, sputtering gasses, bias voltage, power, substrate temperature, and annealing may affect the properties and quality of the sputtered film. See, e.g., Creemer et al., supra, Ponon et al., supra, Pastales et al., supra, and Jeyachandran et al., supra; see also Li-Jian Meng, "Deposition and properties of titanium nitride films produced by dc reactive magnetron sputtering," *Vacuum* 46, 233 (1995); Rajarshi Banerjee et al., "Influence of the sputtering gas on the preferred orientation of nanocrystalline titanium nitride thin films," *Thin Solid Films* 405, 64 (2002); and WILLIAM D. SPROUL et al., "The Effect of Target Power on the Nitrogen Partial Pressure Level and Hardness of Reactively Sputtered Titanium Nitride Coatings," *Thin Solid Films* 171, 171 (1989). Annealing of the film and/or deposition at elevated substrate temperatures are known to lower resistance in most cases. See Patsalas et al., supra, and Ponon et al., supra. It has also been found that higher nitrogen partial pressure produces films with lower resistivity and thus better performance. See Creemer et al., supra.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides a method for producing high-temperature sputtered stoichiometric titanium nitride (TiN) thin films.

In accordance with the method of the present invention, a substrate is placed in a sputtering chamber containing a source of the Ti material to be sputtered, often referred to as the "target." The substrate temperature in the chamber is controlled to be between room temperature (about 20° C.) and about 800° C. The sputtering chamber is then evacuated to a predetermined base pressure, e.g., $2 \times 10^{-7}$ Torr or lower, with lower pressures generally being preferred to avoid oxygen contamination in the final TiN film.

In a next step in accordance with the present invention, the Ti target is presputtered by flowing argon (Ar) gas in the chamber, e.g., at a pressure of 2-15 mTorr and a radio frequency (RF) power of 50-200 W, for a predetermined period of time, typically about 5 minutes. The presputtering is done under the same chamber conditions as used for the sputtering step but without the shutter being opened, so that no deposition on the substrate occurs during presputtering.

Following this presputtering step, in a next step in accordance with the present invention, the shutter in the chamber is opened and a thin, e.g., 6 nm, adhesion layer of Ti is deposited on the substrate. The presputtering step and this initial deposition step help to remove oxide and nitride from the target surface and improve film adhesion at the same time.

The TiN films are then sputtered onto the substrate by depositing Ti onto the substrate in the presence of $N_2$ and Ar gas flows, typically in a few or a few tens sccm range for each gas, with the ratio of $N_2$ to Ar favoring N to ensure that the film is nitrogen-saturated. During an exemplary deposition of the TiN film, the radio frequency (RF) power is kept at 50-200 W and the chamber pressure is maintained at 2-15 mTorr in the presence of the $N_2$ and Ar gases, with lower chamber pressures generally being preferred to enable the growth of denser films. The shutter is left open for a predetermined time to obtain a TiN film having a predetermined thickness.

BRIEF DESCRIPTION OF THE DRAWINGS

FIGS. 2A and 2B contain plots showing resistivity values at 300K for six different Samples of TiN thin films prepared using different deposition parameters in accordance with one or more aspects described herein.

DETAILED DESCRIPTION

Figure 1:
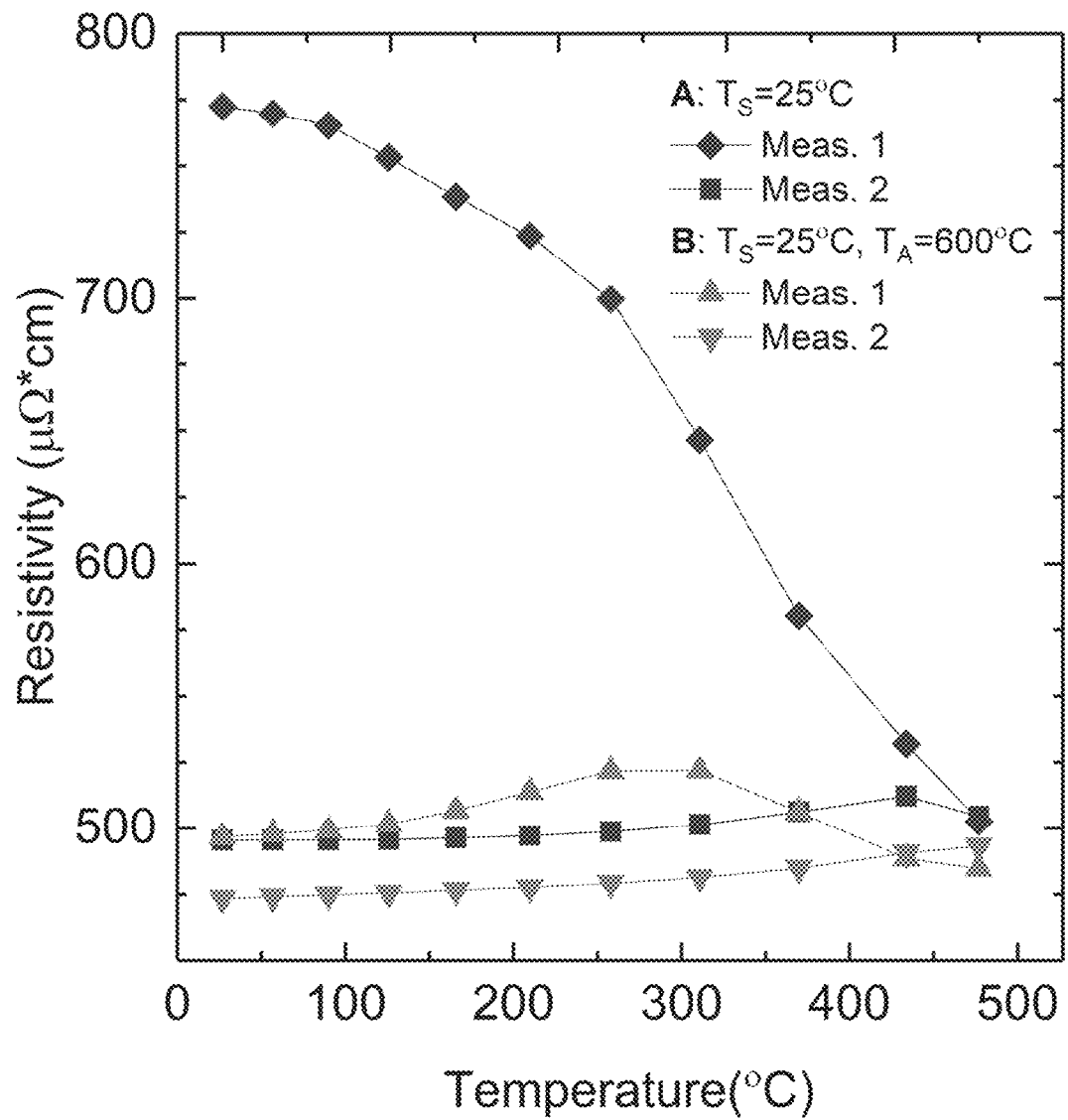
FIG. 1 contains a plot showing results of two consecutive resistivity measurements from 300K to 750K for two different Samples of TiN thin films prepared using different deposition parameters in accordance with one or more aspects described herein.

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present disclosure relates to thin films, particularly to sputtered titanium nitride (TiN) thin films prepared at high substrate temperature and/or annealed at high temperature.

As noted above, annealing and deposition at elevated substrate temperatures are known to lower the resistance of TiN thin films. Consequently, it can be expected that reactively sputtered stoichiometric TiN films that are stable at high temperatures to also be of high quality and low resistivity, and thus also possess a higher temperature coefficient of resistivity (TCR).

The present invention provides methods for fabricating sputtered titanium nitride (TiN) thin films that are prepared at high substrate temperature and/or are annealed at high temperature. TiN thin films prepared in accordance with the present disclosure are suitable for use in many high-temperature applications due to its excellent long term high temperature thermal stability, and may be particularly suitable to serve as metallic contacts and diffusion barriers for thin film nanocrystalline silicon-based thermoelectric devices operating at high temperatures up to 600° C. (873K). In addition, due to their low resistivity and high temperature coefficient of resistivity (TCR), TiN thin films can also be used as electrical conduction layers and resistive temperature sensors.

In the exemplary cases described herein, the TiN thin films were deposited using a magnetron sputtering system, though other appropriate sputtering systems can be used as appropriate.

In the method according to the present invention, a substrate is placed in a sputtering chamber containing a source of the Ti material to be sputtered, often referred to as the "target." The substrate temperature in the chamber is controlled to be between room temperature (about 20° C.) and about 800° C. The chamber is then evacuated to a base pressure of $2 \times 10^{-7}$ Torr or lower to avoid oxygen contamination in the TiN to be deposited. During the deposition process, the chamber pressure can be controllably maintained at 2-15 mTorr in pure Ar, or Ar and $N_2$ gas flows, though in general lower chamber pressures are preferred to enable the growth of denser films. In addition, it is best to use the highest power that a sputtering system can afford without overheating the target in order to obtain the best film quality; for this reason, pulsed DC sputtering may yield even better results than RF power due to its very high transient power during sputtering.

In a next step in accordance with the present invention, the Ti target is presputtered in the chamber by flowing argon (Ar) gas in the chamber at a predetermined ratio and flow rate, predetermined pressure, and predetermined power for a predetermined period of time in order to further reduce the oxygen content in the sputtering chamber and to clean the target surface. The presputtering is done under the same chamber conditions as used for the sputtering step but without the shutter being opened, so that no deposition on the substrate occurs during presputtering. In an exemplary case, the target is presputtered at a pressure of 2-15 mTorr in a radio frequency (RF) power of 50-200 W for about 5 minutes.

Following this presputtering step, in a next step in accordance with the present invention, the shutter in the chamber is opened and a thin, e.g., 6 nm, adhesion layer of Ti from the target is deposited on the substrate. The presputtering step and this inital deposition step help to remove oxide and nitride from the target surface and improve film adhesion at the same time.

The TiN films are then sputtered onto the substrate by depositing additional Ti onto the substrate in the presence of $N_2$ and Ar gas flows, typically in a few or a few tens sccm range for each gas, with the ratio of $N_2$ to Ar favoring N to ensure that the film is nitrogen-saturated. Although a pure $N_2$ flow can work, the addition of some Ar helps to stabilize the plasma created by the RF power under the gas flows. During the deposition of the TiN film, the power and chamber pressures used in the presputtering step are maintained in the presence of the Ar and $N_2$ gases, e.g., the RF power is kept at 50-200 W and the chamber pressure is maintained at 2-15 mTorr in the presence of the $N_2$ and Ar gases.

The shutter is left open for a predetermined time to obtain a TiN thin film having a predetermined thickness.

EXAMPLES

TiN thin films in accordance with the present invention were deposited using an AJA magnetron sputtering system preevaluated to a base chamber pressure of $2\times10^{-7}$ Torr using a 5N 2" Ti target in an Argon (Ar) and Nitrogen ($N_2$) environment on fused silica substrates, with flow rates of 1 sccm and 20 sccm for the Ar and $N_2$, respectively. The target was initially presputtered for 5 minutes, then an adhesion layer of 6 nm Ti was deposited thereon in pure Ar gas flow and with a RF power of 100 W. During sputtering, an RF power of 100 W was used, resulting in a power density of 4.94 W/cm$^2$ in the presence of N and Ar gas at a pressure of 3 mTorr in a 20:1 ratio favoring N to ensure that the films were nitrogen-saturated.

Six Samples were prepared with varying substrate temperatures and methods of annealing. The Samples, described herein as Samples A-F, were studied by the inventors to examine the effects of different deposition conditions on TiN thin films For Samples A-E, deposition of the thin film took approximately 2 hours while Sample F required only 1 hour, due to the elevated deposition rate. Substrate temperatures of 25° C., 350° C., and 600° C. were used.

Samples B, D and E were annealed in the sputtering chamber in vacuum for 4 hours at 600° C. While Samples B and E were removed from the sputtering chamber and were later loaded back in for their annealing steps, Sample D was annealed in the sputtering chamber without breaking vacuum.

Samples A and C were prepared under the same deposition conditions as used for Samples B and E, respectively, except that they were not returned to the sputtering chamber and were left unannealed. The deposition and annealing parameters are summarized in Table I below.

TABLE I

Sputtered TiN names, deposition parameters, and characterizations in comparison with the bulk

| Sample | N:Ar | Substrate ° C. | Annealing ° C. | Thickness Å | Deposition Rate Å/s | Crystal Size nm | Ti:N | Density g/cm³ |
|---|---|---|---|---|---|---|---|---|
| A | 20:1 | 25 | — | 782 | 0.1086 | — | — | — |
| B | 20:1 | 25 | 600* | 782 | 0.1086 | 5.5 | — | — |
| C | 20:1 | 350 | — | 571 | 0.0758 | — | — | — |
| D | 20:1 | 350 | 600 | 625 | 0.086 | 12.4 | 1:1.04 | 3.78 |
| E | 20:1 | 350 | 600* | 571 | 0.0758 | — | — | — |
| F | 20:1 | 600 | — | 580 | 0.161 | 15.6 | 1:0.98 | 4.14 |
| Bulk | | | — | | | | 1:1 | 5.22 |

*Samples B and E were removed from the sputtering chamber and later returned to chamber for annealing.

An epsilometer was used to measure film thicknesses and the results were confirmed using a step profilometer giving values between 57.1 and 78.2 nm, as shown in Table I. Density (using thickness from epsilometer) and Ti:N ratio of Sample C and F were obtained from Rutherford Backscattering performed by EAG laboratories and show that the Samples are nearly stoichiometric, but less dense than bulk TiN. Square pieces were cut using a laser cutting tool and Aluminum wire bonds were made directly to the TiN near the corners of the Sample. After this, each Sample was placed in a Janis VPF-800 cryostat and a four point Van der Pauw method was used to determine electrical resistivity at each preset temperature between 300 and 750 K in the order of increasing temperature. At each temperature point, the Sample was held for as long as it took for its resistance to stabilize. This includes time for thermal equilibrium and for additional structural relaxation for some Samples. Only the final, stable resistivity value was used for analysis.

After resistance measurements, the Samples were characterized using grazing-incidence X-ray diffraction (XRD) measurements using a Rigaku SmartlLab X-ray diffractometer using fixed CuKa radiation in parallel-beam mode. The angle of incidence was set to 0.5°θ and the detector was rotated to measure from 20 to 70° in increments of 0.02° 2θ and counts were accumulated for 1 s at each step. Sample height alignment was conducted via Rigaku's automated height-alignment function for flat Samples. The Raman spectra were acquired with a home-built confocal micro-Raman setup composed of: a 0.5 m single spectrometer using a 1800 groove/mm grating; a liquid nitrogen cooled back-thinned/deep-depleted CCD sensitive in the visible-near IR spectral range; and a single-mode 488 nm laser with typical spot size <1 μm and intensity ~2 mW at the Sample.

FIG. 1 shows the results of two consecutive resistivity measurements from 300K to 750K for Sample A and B. As Sample A was deposited at room temperature and not annealed, the film underwent an irreversible structural relaxation with increasing temperature in the first run. Its resistivity drops 35%. Note that at each temperature point, we allowed sufficient amount of time for the film to reach thermal equilibrium with the stage, but the time may still not enough for structural relaxation of the film. At the second run, Sample A starts with a much lower resistivity and shows a sign of positive TCR. The slight drop of resistivity at the highest temperature is a sign of further structural relaxation of the film. Because of the 4 hour annealing at 600° C., Sample B starts with a resistivity similar to that of Sample A at the second run with a positive TCR. The decrease of resistivity at higher temperature (>550 K) is a sign of further structural relaxation, indicating the effect of its annealing is limited. For the second run, its resistivity starts at a 10% lower value and shows a positive TCR throughout the investigated temperature range. These results demonstrate that TiN films deposited at room temperature will experience structural changes as temperature is increased resulting in a reduction in resistivity as observed previously. See Tarniowy et al., supra. Annealing helps but is still far from enough because both the room temperature resistivity and TCR of Sample B at the second run are far worse than those deposited at elevated substrate temperatures. See Creemer et al., supra.

The experiments shown in FIG. 1 were carried out for all Samples investigated in this work. For each Sample, up to four resistivity experiments were conducted. Resistivity values taken at the start of each measurement at 300K are displayed in FIG. 2(a). As Samples A and B, deposited at room temperature, have far higher resistivity values than the rest, Samples C-F are replotted in FIG. 2(b) with an enlarged scale for clarity. In general, the room temperature resistivity starts to saturate after the second run for all Samples; the slight increase of resistivity for each consecutive run may be caused by oxidation during experiments as the cryostat vacuum is typically maintained at $10^{-5}$ Torr above room temperature.

The drop of resistivity of Sample A and B from the first to the second run due to structural relaxation is also observed in Sample C, which was deposited at 350° C. and unannealed; but not in Sample E, which came from the same deposition but was annealed at 600° C. Room temperature resistivity wise, Sample F has the smallest value, followed by Sample D. Our results show that high substrate temperature is the most important parameter to reach low resistivity with high structure stability. Annealing helps, but is secondary.

An interesting observation is that annealing right after deposition without breaking vacuum has a sizable effect to reduce resistivity: resistivity of Sample D is about 13% lower than that of Sample E which is annealed after breaking the vacuum and is just 10% higher than that deposited at 600° C. It could be that diffusion of oxygen after breaking the vacuum makes the annealing less effective. This result demonstrates that to produce a high quality TiN thin film material with low and reproducible resistivity it is important to reach a dense and well relaxed stable structure.

Figure 3:
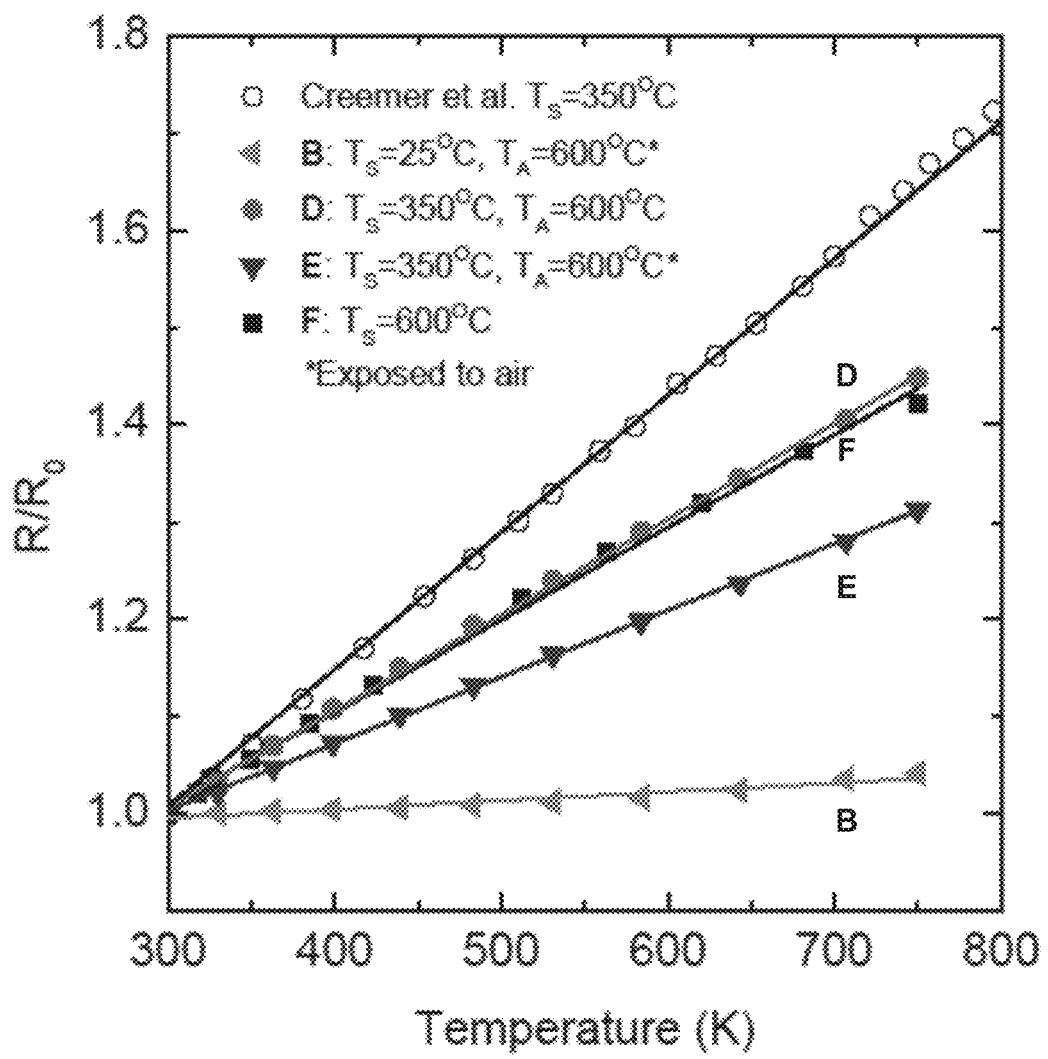
FIG. 3 contains a plot showing the temperature-dependent relative change of resistance for various TiN thin films including films prepared using different deposition parameters in accordance with one or more aspects described herein.

Temperature dependent resistance for several Samples is shown in FIG. 3 with a comparison to that in Creemer et al., supra. These results are from the second measurement taken for each Sample and are consistent with later measurements, although, as FIG. 2 suggests, the overall resistivity of the annealed Samples did increase slightly with subsequent measurements. Samples F and D show the highest TCR values of 0.0952 and 0.0985%/K, respectively. Exposure to air before annealing reduced its TCR to 0.0685%/K for Sample E, despite otherwise identical deposition conditions to Sample D. Sample B shows a far weaker TCR of 0.009%/K, likely due to the fact that it was deposited at room temperature and also exposed to air, both of which resulted in a far higher room temperature resistivity value to begin with. It should be noted that the films in Creemer et al., supra are 200 nm thick, compared to the 60 nm films examined here, resulting in less surface scattering of electrons and thus improved TCR. As a rule of thumb, metals tend to have TCR values of 0.1%/K, consistent with all the Samples shown in FIG. 3 except for Sample B. The resistivity and TCR achieved in this work is acceptable for sensor and conductive barrier layer applications for temperatures up to 500° C.

Figure 4:
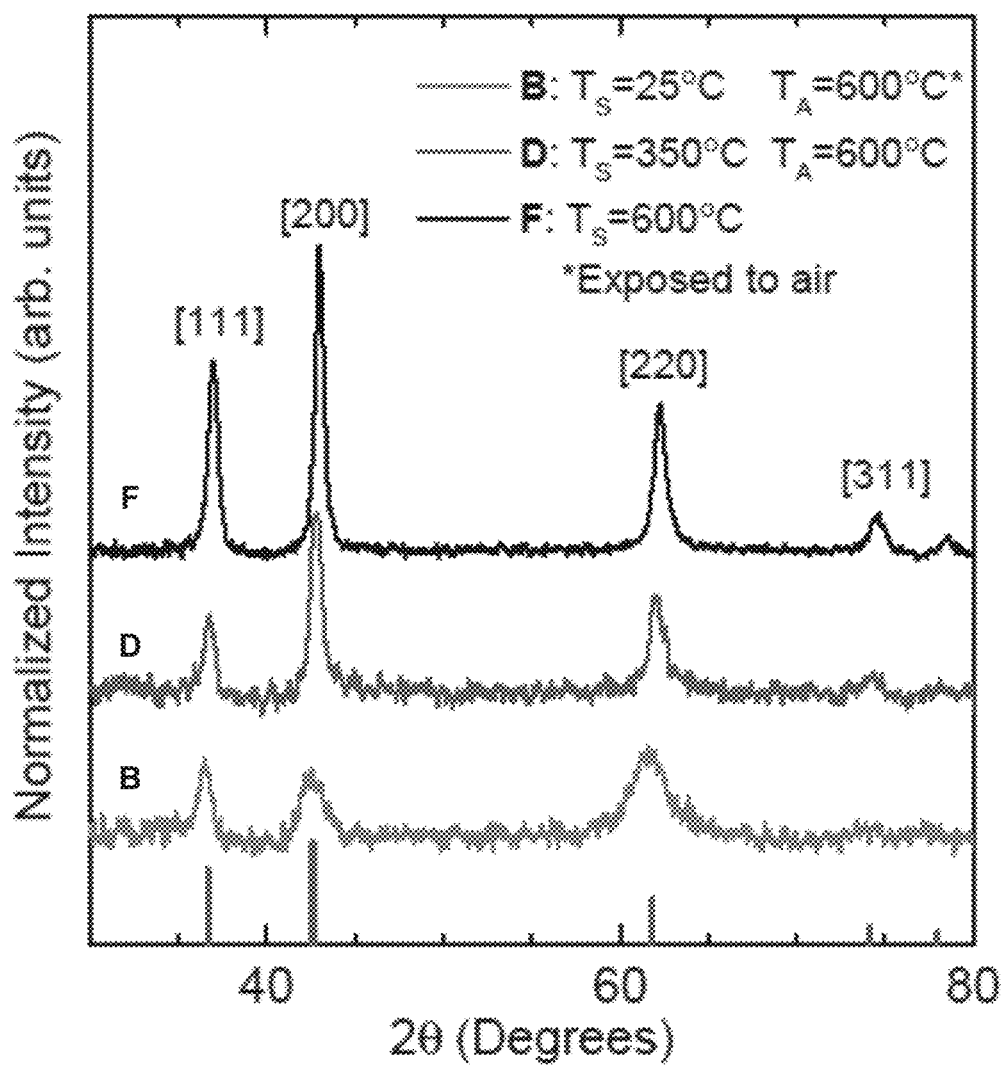
FIG. 4 contains plots showing the results of X-ray diffraction (XRD) measurements of several Samples of TiN thin films prepared using different deposition parameters in accordance with one or more aspects described herein.

In order to understand the structural changes of the Samples studied in this work, we show XRD results of Samples B, D, and F in FIG. 4. Note that the XRD were performed post resistivity measurements. So additional structural changes after consecutive measurement cycles to 750K should be taken into account. Peaks associated with the (111), (200), and (220) planes of TiN (ICDD #03-065-0565) are visible, and the peak positions suggest all Samples are in the B1 cubic phase of stoichiometric TiN, as expected with the unity Ti:N ratio of Samples D and F from RBS. In contrast to the films examined in Hong-Ying Chen et al., "Oxidation behavior of titanium nitride films," *Journal of Vacuum Science & Technology A: Vacuum, Surfaces, and Films* 23, 1006 (2005), the films in Samples D and F exhibited no peaks associated with rutile-$TiO_2$, even though the XRD were measured months after resistivity measurements were completed.

Using the Scherrer equation, the average crystalline grain sizes for Samples B, D, and F, respectively, are estimated to be 5.5 nm, 12.4 nm, and 15.6 nm as reported in Table I. This is consistent with the above resistivity and TCR results: larger grain size is associated with low resistivity and higher TCR. Upon closer inspection, we find that Sample F shows clear crystalline peaks with relative intensity ratio of its peaks comparable to that of ICDD #03-065-0565 including the (311) peak, indicating this film does not have a preferred orientation. In contrast, Sample B has a relatively similar intensity for all the three visible peaks and Sample D has higher intensity in (220) than in (111). For Samples B and D, the (311) peak is not as visible as in Sample F. All these deviations in the relative diffraction peak intensities in Samples B and D from that of ICDD #03-065-0565 implies some preferred crystalline orientations as a result of post-deposition structural relaxation, confirming that high substrate temperature is the most important parameter to produce high quality TiN thin films and the annealing is the second. In all Samples, the height of the (111) peak does not exceed that of the (200) peak. This is consistent with the high-stress TiN from high nitrogen concentrations, as low-stress films tend to display a prominent (111) orientation. See, e.g., Li-Jian Meng, "Characterization of Titanium Nitride Films Prepared by D.C. Reactive Magnetron Sputtering at Different Nitrogen Pressures," *Surface and Coatings Technology* 90, 64 (1997). However, variations in the preferred orientation of these films should not necessarily be linked entirely to stress, as Banerjee et al. obtains a preferred (200) orientation with a change in sputtering gasses. See Rajarshi Banerjee, "Influence of the Sputtering Gas on the Preferred Orientation of Nanocrystalline Titanium Nitride Thin Films," *Thin Solid Films* 405 (2002) 64-72. Note that none of our Samples show the (211) peak for $Ti_2N$ at ~50 2θ, see Tarniowy et al., supra, consistent with the RBS results showing an essentially stoichiometric composition.

Figure 5:
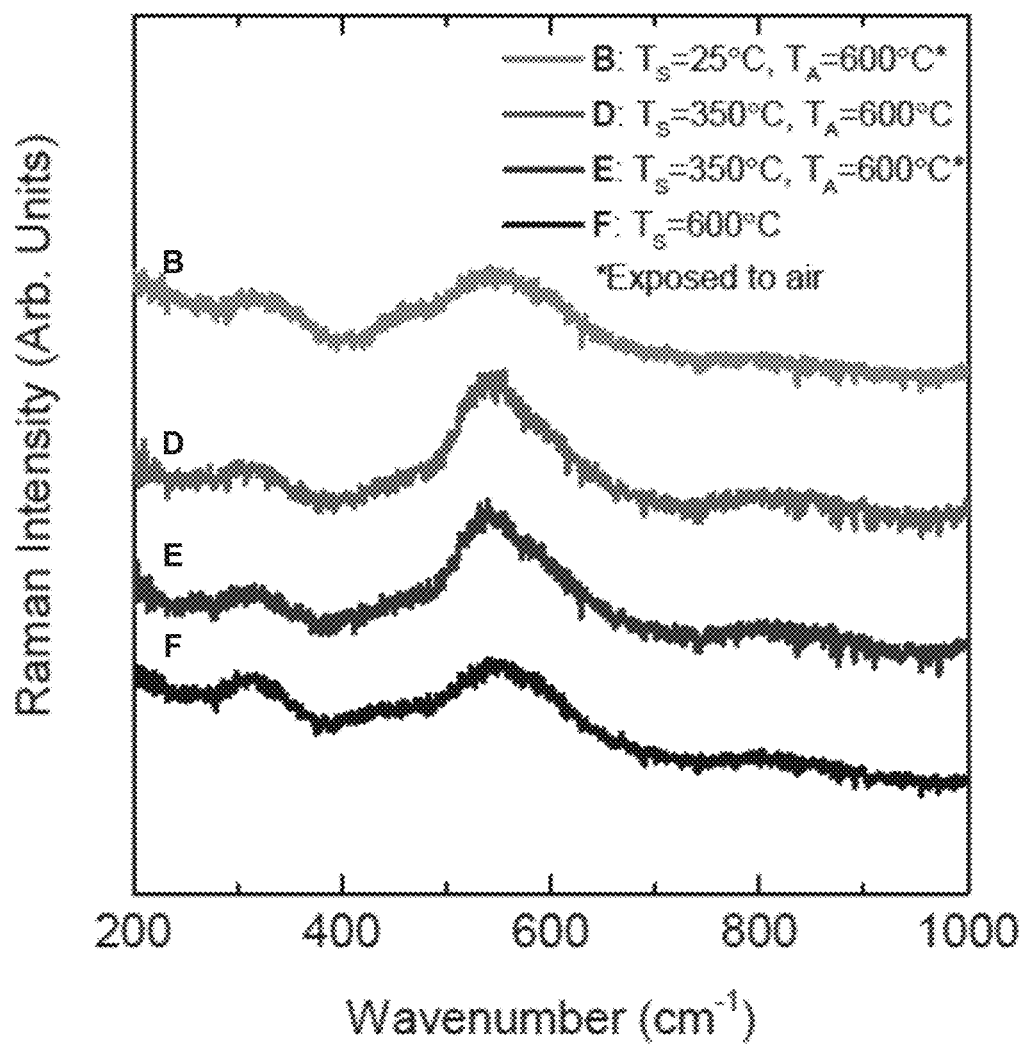
FIG. 5 contains plots showing the results of Raman spectroscopy for several Samples of TiN thin films prepared using different deposition parameters in accordance with one or more aspects described herein.

Results for Raman spectroscopy for Samples B, D, E, and F are shown in FIG. 5. In the case of B1 cubic TiN as determined by the XRD above, a perfect crystal forbids first order Raman scattering, so it is known that the observed Raman scattering spectra is due to microscopic defects, specifically vacancies in Ti and N. Our results are similar to those obtained in other studies, see, e.g., Ponon et al., supra, showing two peaks below 300 $cm^{-1}$ (one is only partially visible due to filter cutoff in our Raman setup) and a peak at around 550 $cm^{-1}$. There is additionally a second order peak near 450 $cm^{-1}$. The two peaks below 300 $cm^{-1}$ are TA and LA modes associated with Ti, and thus N vacancies, while the peak at around 550 $cm^{-1}$ is a TO mode associated with N, and thus Ti vacancies. It is clear that Samples D and E have a significant TO peak suggesting a larger amount of Ti vacancies in D and E compared to Samples B and F. This is consistent with the RBS results in Table I showing a Ti:N ratio of 1:1.04 for D vs 1:0.98 for Sample F, indicating that D is slightly N-rich while F is slightly Ti-rich. Because Sample E shows the same large TO peak as Sample D and it was deposited under identical conditions to Sample D, it is likely also slightly N-rich. Sample B seems to be dominated by N vacancies, yet oxidation should remove Ti emphasizing Ti vacancies and thus the TO peak near 550 $cm^{-1}$ suggesting that oxidation of Sample B is likely relatively minimal. Sample E was also exposed to air before annealing, yet there does not appear to be an increase in the TO peak associated with N vacancies compared to Sample D, also suggesting minimal oxidation.

Advantages and New Features

This invention is related to the inventors' previous patents regarding growth of nanocrystalline silicon for thermoelectric applications. See U.S. Pat. Nos. 9,472,745 and 9,577,174, supra. The goal of those patents as well as the present invention is to provide material support for nanocrystalline silicon-based high temperature thermoelectric devices, support which is currently unavailable from existing materials.

Magnetron sputtering of TiN thin films in accordance with the present invention is advantageous in that it involves low levels of impurities with easy control of the deposition parameters, which permit the further improvement of the thermal stability and structural and electrical performance of TiN thin films for high temperature applications. High substrate temperature is the most important parameter enabling this goal to be reached, but both the substrate temperature and the annealing temperature reached in this work are as high as is currently possible, and further increases of substrate temperature where possible may still further improve the film quality.

In comparison to other high temperature resistive temperature sensing thin films, like Pt and polycrystalline silicon, TiN is both more chemistry inert and diffusion resistant, although its TCR is slightly lower. See Creemer et al., supra. In terms of electrical conduction layer and metallic contacts, TiN offers superior low resistivity, perhaps even better than metallic platinum. In particular, TiN has been tested to be CMOS compatible, and thus perfectly suitable for application in modern microelectronic devices. Id.

Alternatives

As mentioned above, more parameter space will be explored in combination with film structural and electronic property characterizations to further improve the performance of TiN thin films for high temperature applications. Although sputtering is one of the most convenient deposition methods, TiN can also be deposited by an array of other deposition methods. We expect that high substrate temperature may yield similar results whichever method is used. In addition, other competitive metal oxides and nitrides exist, such as tantalum nitride, indium oxide, tungsten nitride. Their usability and high temperature structural and thermal stability depends on the details of their structure and phase diagrams.

Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. A process for making a titanium nitride (TiN) thin film for a nanocrystalline silicon-based thermoelectric device operating at a temperature of up to 600° C., comprising:

placing a nanocrystalline silicon (nc-Si) substrate into a sputtering chamber containing a Ti target and controlling a temperature of the nc-Si substrate in the chamber to be maintained at a predetermined temperature between 20° C. and 800° C.;

evacuating the chamber to a predetermined base pressure of $2 \times 10^{-7}$ or lower;

while a sputtering shutter in the chamber is closed, flowing argon (Ar) gas into the chamber at a predetermined controlled gas pressure between 2 and 15 mTorr and applying a predetermined radiofrequency (RF) power between 50 and 200 W for about 5 minutes to presputter the Ti target in the chamber;

while maintaining the predetermined controlled gas pressure and the RF power in the chamber, opening the sputtering shutter and sputtering Ti from the target onto the substrate in a presence of an Ar gas flow having a predetermined flow rate of about 1 sccm to form an initial adhesion layer of Ti having a predetermined thickness on the substrate; and while continuing to maintain the predetermined controlled gas pressure and the RF power in the chamber, flowing nitrogen ($N_2$) gas into the chamber at a predetermined flow rate of about 20 sccm for a predetermined time while continuing to sputter the Ti in the presence of the Ar gas flow to form a TiN film having a predetermined thickness on the initial Ti adhesion layer, a ratio of the $N_2$ to the Ar being configured to produce a predetermined stoichiometry in the TiN film;

wherein the substrate temperature, the flow rates of the Ar and $N_2$ in the chamber, and the RF power produce a TiN thin film having a reproducible metallic resistivity and a temperature coefficient of resistance that is maintained when the TiN thin film is subjected to repeated thermal cycling;

wherein the TiN film has a high-temperature thermal stability with no interdiffusion between the nanocrystalline silicon and the TiN film; and wherein the device can operate at temperatures of up to 600° C. because of the thermal stability of the TiN film.

2. The process according to claim 1, further comprising annealing the TiN film in the sputtering chamber, wherein at least one of the annealing time and the annealing temperature are configured to further provide a predetermined level of resistivity in the TiN film.

3. The process according to claim 2, wherein the TiN film is annealed in vacuum for 4 hours at 600° C.

4. The process according to claim 1, wherein the TiN film is annealed in the sputtering chamber without breaking a vacuum in the chamber.

* * * * *